(12) United States Patent
Ogawa

(10) Patent No.: US 7,629,834 B2
(45) Date of Patent: Dec. 8, 2009

(54) LIMITER CIRCUIT

(75) Inventor: Hayato Ogawa, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 18 days.

(21) Appl. No.: 11/723,025

(22) Filed: Mar. 16, 2007

(65) Prior Publication Data

US 2007/0257730 A1 Nov. 8, 2007

(30) Foreign Application Priority Data

Mar. 17, 2006 (JP) ............... 2006-074349
Apr. 14, 2006 (JP) ............... 2006-111627

(51) Int. Cl.
G05F 1/46 (2006.01)
H03K 17/16 (2006.01)
(52) U.S. Cl. ............... 327/543; 327/309; 327/540
(58) Field of Classification Search ............... 327/306, 327/309, 321, 540, 543
See application file for complete search history.

(56) References Cited

U.S. PATENT DOCUMENTS

| 4,482,985 A | 11/1984 | Itoh et al. | |
|---|---|---|---|
| 5,311,069 A * | 5/1994 | Austin | 327/261 |
| 5,793,239 A * | 8/1998 | Kovacs et al. | 327/262 |
| 5,936,393 A * | 8/1999 | Nauta | 323/316 |
| 6,204,646 B1 * | 3/2001 | Hiramatsu et al. | 323/273 |
| 6,356,141 B1 * | 3/2002 | Yamauchi | 327/543 |
| 6,448,916 B1 * | 9/2002 | Leung | 341/144 |
| 6,590,444 B2 * | 7/2003 | Ikehashi et al. | 327/541 |
| 6,777,752 B2 * | 8/2004 | Osanai et al. | 257/350 |
| 6,943,592 B2 * | 9/2005 | Degoirat et al. | 327/77 |

FOREIGN PATENT DOCUMENTS

JP      58-070482      4/1983

* cited by examiner

Primary Examiner—Dinh T. Le
(74) Attorney, Agent, or Firm—Foley & Lardner LLP

(57) ABSTRACT

A limiter circuit includes a differential amplifier circuit having a non-inverting and an inverting inputs, the inverting input fed with an input signal to the limiter circuit, a driving circuit fed with an output of the differential amplifier, a MOS transistor having a source, a drain and a gate, one of the source and the drain of the MOS transistor connected to an output of the driving circuit, the other of the source and the drain of the MOS transistor connected to the non-inverting input of the differential amplifier, the gate of the MOS transistor applied with a predetermined voltage, and a load circuit connected to the other of the source and the drain of the MOS transistor.

17 Claims, 8 Drawing Sheets

RELATED ART

RELATED ART

LIMITER CIRCUIT

BACKGROUND OF THE INVENTION

1. Field of the Invention

The present invention relates to a limiter circuit for limiting an output signal level to a predetermined range.

2. Description of Related Art

In recent years, along with miniaturization and higher integration of devices in LSI, there are increasing number of circuits that operate with low voltages. Further, several circuits with different operating voltages are often mounted to one LSI. In such case, if an overvoltage more than a specified operating voltage is applied to a circuit that operates with a low voltage, the circuit may be destroyed as the overcurrent flows through the circuit. Accordingly, when outputting a signal from a circuit that operates with a high voltage to a circuit that operates with a low voltage, a voltage level of an output voltage must be limited by a limiter circuit.

FIG. 10 is a configuration example showing an apparatus including two circuits that operate with different voltages and a limiter circuit. In FIG. 10, a first circuit 1 is a circuit operating with a power supply voltage VDD1. A second circuit 2 is a circuit operating with a power supply voltage VDD2. A limiter circuit 3 takes an output voltage from the first circuit 1 as an input signal, where the output voltage from the first circuit 1 fluctuates within a voltage range from a ground level 0V to the power supply voltage VDD1, and limits a voltage level to the power supply voltage VDD2 or less so as to output to the second circuit 2.

FIG. 11 is a specific configuration example showing a first circuit 1. In FIG. 11, an input voltage $V_{IN}$ is applied to an inverting input of a differential amplifier 5, and an output from the differential amplifier 5 is connected to a gate of a Pch-MOS transistor MP1. A source of the transistor MP1 is connected to the power supply voltage VDD1. A drain of the transistor MP1 outputs an output voltage $V_{OUT1}$ of the first circuit 1 and also is connected to a non-inverting input of the differential amplifier 5 and a constant current source 4. Another end of the constant current source 4 is connected to ground. With this configuration, when the transistor MP1 is operated in a saturation region and a loop gain of the differential amplifier circuit 5 is large enough, a differential input voltage of the differential amplifier 5 becomes small and satisfies that output voltage $V_{OUT1}$ is nearly equal to input voltage $V_{IN}$.

As a configuration example of the limiter circuit 3, a configuration disclosed in Japanese Unexamined Patent Application Publication No. 58-70482 is shown in FIG. 12. In the limiter circuit 3 of FIG. 12, QL, QLL and QD are Nch-MOS transistors. An input voltage from the first circuit 1 is applied to an input terminal of the pulse generator 100. A non-inverting output of the pulse generator 100 is connected to a gate of the transistor QL. An inverting output of the pulse generator 100 is connected to a gate of the transistor QD. Further, a fixed voltage VLL is applied to a gate of the transistor QLL by a voltage converter 101. A drain of the transistor QL is connected to a power supply voltage VCC, and a source of the transistor QL is connected to a drain of the transistor QLL. Furthermore, a source of the transistor QLL is connected to the drain of the transistor QD, and a source of the transistor QD is connected to ground. Additionally, the drain of the transistor QD is output as an output voltage of the limiter circuit 3.

If the input voltage $V_{OUT1}$ for the pulse generator 100 becomes a high voltage, a gate voltage of the transistor QD changes from a high voltage to a ground level by an operation of the pulse generator 100. Accordingly the transistor QD turns OFF and at the same time, the gate voltage of the transistor QL changes from the ground level to the power supply voltage level VCC. As a result, the transistor QL turns ON.

Here, as the constant voltage VLL is applied to the gate of the transistor QLL, if an output voltage $V_{OUT2}$ exceeds VLL−VTH, the transistor QLL turns OFF. Accordingly the limiter circuit 3 operates so that the output voltage $V_{OUT2}$ does not exceed VLL−VTH. Note that the voltage VTH is a threshold voltage of the transistor QLL.

Specifically, assuming a threshold voltage of the limiter circuit 3 that is determined by the transistors QL and QD to be VTQ, when the input voltage $V_{OUT1}$ is higher than VTQ, the output voltage $V_{OUT2}$ is limited to VLL−VTH. Further, when the input voltage $V_{OUT1}$ is lower than VTQ, the output voltage $V_{OUT2}$ becomes the ground level. FIG. 13 shows a relationship between the input voltage $V_{OUT1}$ and the output voltage $V_{OUT2}$.

FIG. 14 is a configuration diagram showing the limiter circuit 3 for limiting a voltage level of the output voltage using another method. In the limiter circuit 3 shown in FIG. 14, buffer circuits 200 and 201 output signals that are almost equal to input signals. Specifically, the buffer circuit 200 is disposed in order to increase an input impedance, while the buffer circuit 201 is disposed in order to decrease an output impedance. A resistance R functions as a current limit for preventing an overcurrent from flowing from the buffer circuit 200 to a voltage source 6.

In the circuit shown in FIG. 14, assuming a voltage value of the voltage source 6 to be VL and a forward voltage of the diode D to be VDT, when the input voltage $V_{OUT1}$ is VL+VDT or less, the output voltage $V_{OUT1}$ becomes almost same as the input voltage $V_{OUT1}$. On the other hand, when the input voltage $V_{OUT1}$ is more than VL+VDT, the diode D becomes forward bias and conductive. Accordingly the limiter circuit 3 of FIG. 3 operates so that the output voltage $V_{OUT2}$ does not exceed VL+VDT.

However it has now been discovered that in the abovementioned limiter circuit tends to generate the output voltage including an error.

To be more specific, in the limiter circuit 3 shown in FIG. 12, the output voltage $V_{OUT2}$ changes from the ground level 0V to a limited voltage VLL−VTH with the threshold voltage VTQ as a boundary that is determined by the transistors QL and QD. Accordingly the voltage level of the output voltage $V_{OUT2}$ is limited to the ground level 0, which is a lower limit value, or VLL−VTH, which is an upper limit value. As described in the foregoing, the limiter circuit 3 shown in FIG. 12 is not able to output a middle voltage between the lower limit value 0V and the upper limit value VLL−VTH, thus when the input voltage is an analog signal, there is a problem that the input voltage cannot be correctly transmitted to an output side.

Further, as the limiter circuit 3 shown in FIG. 14 includes many devices, signal transmission errors can easily be generated caused by characteristic fluctuation of the resistance R, diode D, buffer circuits 200 and 201.

SUMMARY OF THE INVENTION

According to a first embodiment of the present invention, there is provided a limiter circuit that includes a differential amplifier circuit having a non-inverting and an inverting inputs, the inverting input fed with an input signal to the limiter circuit, a driving circuit fed with an output of the differential amplifier, a MOS transistor having a source, a drain and a gate, one of the source and the drain of the MOS transistor connected to an output of the driving circuit, the other of the source and the drain of the MOS transistor connected to the non-inverting input of the differential amplifier, the gate of the MOS transistor applied with a predetermined voltage, and a load circuit connected to the other of the source and the drain of the MOS transistor.

As set forth above, the limiter circuit according to the first embodiment of the present invention has a configuration in which the output of the driving circuit is fed back to an input of the driving circuit via the MOS transistor having a predetermined voltage is applied to its gate, and the differential amplifier. With this configuration, in the limiter circuit, if a voltage level of the input signal is equal to or less than the upper limit value determined by the predetermined voltage that applied to the gate of the MOS transistor, an output voltage of the limiter circuit changes along with the input voltage of the limiter circuit. Further, after the input voltage reached the upper limit value, the circuit operates to limit the output voltage of the limiter circuit to the upper limit value. Accordingly it is possible to limit a voltage even when the input voltage is an analog signal including a middle voltage level.

Further the limiter circuit of the first embodiment enables to limit the output voltage with a simple configuration in which the MOS transistor that is fed with the predetermined voltage to its gate is inserted to an output portion of the first circuit shown in FIG. 11. Further, by performing a feedback control as described above, an error of the output voltage can be suppressed. Accordingly the limiter circuit of the first embodiment of the present invention is able to suppress signal transmission errors as compared to the limiter circuit of FIG. 14.

According to a second embodiment of the present invention, there is provided a limiter circuit that includes a differential amplifier circuit having a non-inverting and an inverting inputs, the inverting input fed with an input signal to the limiter circuit, a driving circuit fed with an output of the differential amplifier, an output of the driving circuit connected to the non-inverting input of the differential amplifier, a MOS transistor having a source, a drain and a gate, one of the source and the drain of the MOS transistor connected to the output of the driving circuit, the gate of the MOS transistor applied with a predetermined voltage, and a load circuit connected to the other of the source and the drain of the MOS transistor.

As set forth above, the limiter circuit according to the second embodiment of the present invention as with the limiter circuit of the first embodiment has a configuration in which the output of the driving circuit is fed back to an input of the driving circuit via the differential amplifier. Accordingly it is possible to limit a voltage even when the input voltage is an analog signal. Further the limiter circuit of this embodiment enables to limit the output voltage level with a simple configuration in which the output voltage level of the limiter circuit of this embodiment is limited to the predetermined level or less. Thus it is possible to suppress signal transmission errors as compared to the limiter circuit of FIG. 14.

According to a third embodiment of the present invention, there is provided a limiter circuit to limit an output signal to a predetermined range that includes a differential amplifier circuit having a non-inverting and an inverting inputs, the inverting input fed with an input signal to the limiter circuit, a driving circuit fed with an output of the differential amplifier, a feedback path being configured to connect an output of the driving circuit to the non-inverting input, and a switching device being configured to operate to limit an output signal level of the limiter circuit to a first predetermined limit value or less.

As set forth above, the limiter circuit according to the second embodiment of the present invention as with the limiter circuit of the first embodiment has a configuration in which the output of the driving circuit is fed back to an input of the driving circuit via the differential amplifier. Accordingly it is possible to limit a voltage even when the input voltage is an analog signal. Further the limiter circuit of this embodiment enables to limit the output voltage with a simple configuration using a switching device that operates to limit the output voltage of the limiter circuit of this embodiment to the first predetermined level or less. Thus it is possible to suppress signal transmission errors as compared to the limiter circuit of FIG. 14.

The present invention provides a limiter circuit capable of limiting a voltage for an analog signal and has an output voltage with errors suppressed.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

Figure 1:
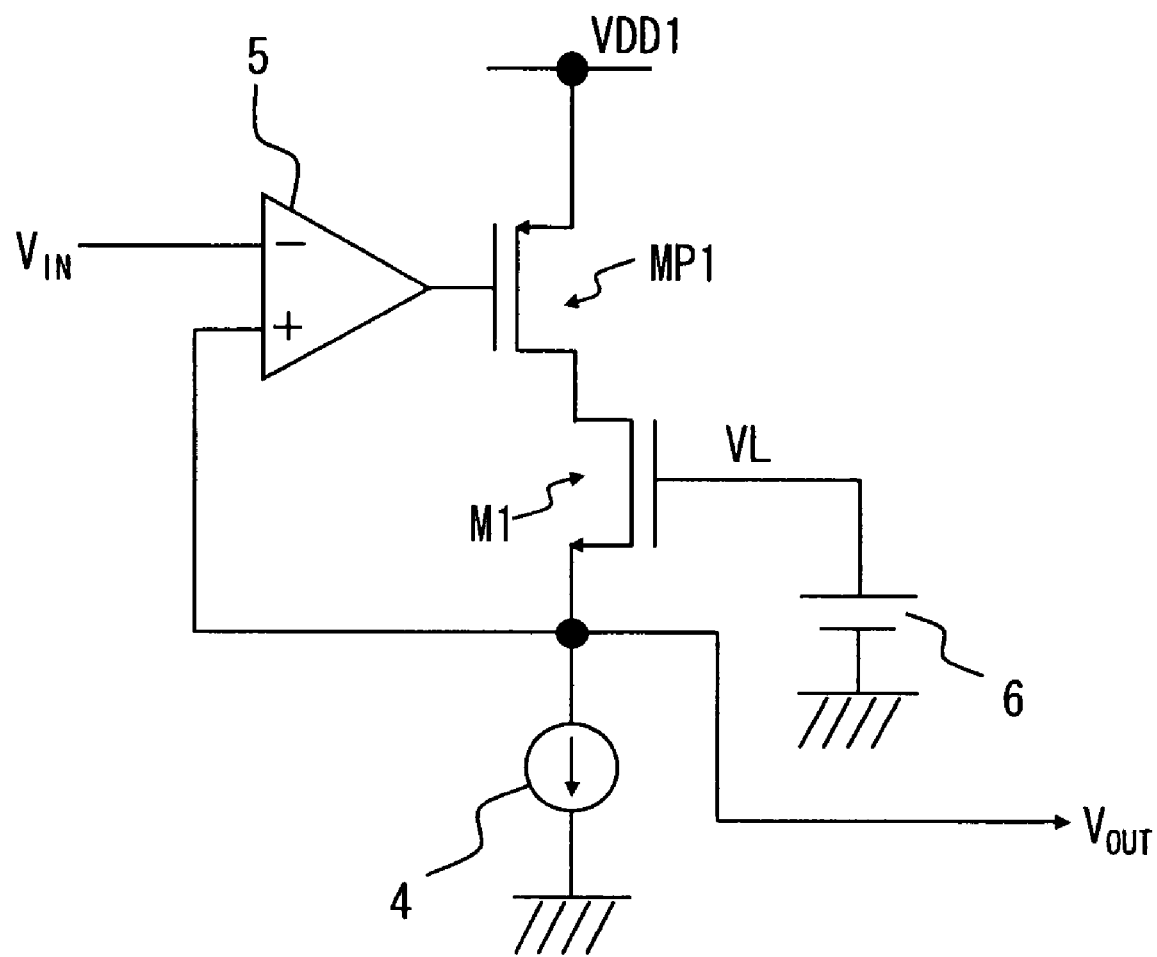
FIG. 1 is a view showing a configuration of a limiter circuit according to a first embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

In the description which follows, like parts are marked throughout the specification and drawings with the same reference numerals respectively, with descriptions not repeated in the interest of clarity and conciseness.

First Embodiment

Figure 11:
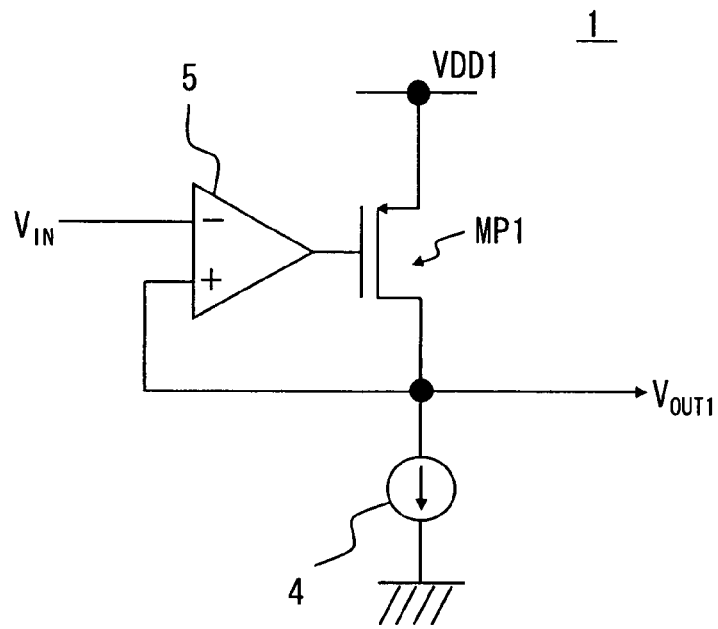
FIG. 11 is a view showing a configuration of the conventional first circuit.

FIG. 1 is a block diagram showing a configuration of a limiter circuit 10 according to this embodiment. In FIG. 1, the configuration is the same as the first circuit of FIG. 11 in that the input voltage $V_{IN}$ is fed to an inverting input of the differential amplifier 5, the output of the differential amplifier 5 is connected to a gate of a transistor MP1 and a source of the transistor MP1 is connected to the power supply voltage VDD1.

Further in the limiter circuit 10 of this embodiment, a drain of the transistor MP1 is connected to a drain of an Nch-MOS transistor M1. A source of the transistor M1 is connected to one end of the constant current source 4 and also to a non-inverting input of the differential amplifier 5, and a feedback path is formed by the differential amplifier 5, the transistor MP1 and the transistor M1. Further, a constant voltage VL that is generated by a voltage source 6 is applied to a gate of the transistor M1, and the source of the transistor M1 is the output voltage $V_{OUT}$ of the limiter circuit 10.

In the limiter circuit 10, the transistor MP1 has a function as a driving circuit for driving the output voltage $V_{OUT}$. The constant current source 4 has a function as a load circuit for the driving circuit.

It is understood that the circuit configuration shown in FIG. 1 is illustrative only and that the same functionality could be achieved with a different configuration. For example as shown in FIG. 2, it can be achieved by changing the transistor MP1 that functions as a driving circuit to an Nch-MOS transistor and changing the positions of the constant current source 4 that functions as a load circuit for the driving circuit.

Figure 2:
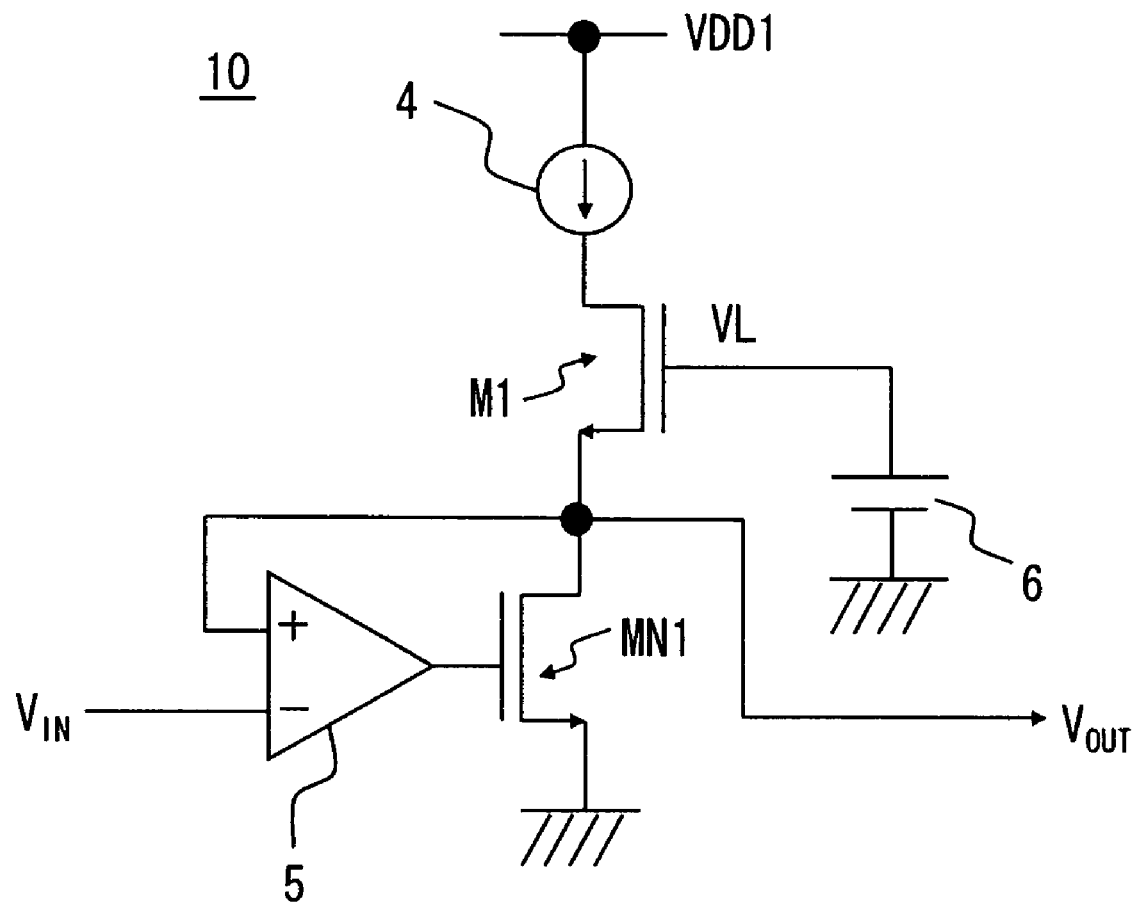
FIG. 2 is a view showing another configuration to realize an equivalent operation as the limiter circuit of FIG. 1.

In the limiter circuit 10 shown in FIG. 2, the input voltage $V_{IN}$ is fed to the inverting input of the differential amplifier 5. The output of the differential amplifier 5 is connected to a gate of an Nch-MOS transistor MN1. A source of the transistor MN1 is connected to ground. A drain of the transistor MN1 is connected to the source of the Nch-MOS transistor M1 and to the non-inverting input of the differential amplifier 5. A feedback path is formed by the differential amplifier 5 and the transistor MN 1. Further, the drain of the transistor MN1 is to be the output voltage $V_{OUT}$ of the limiter circuit 10.

The drain of the transistor M1 is connected to one end of the constant current source 4, and another end of the constant current source 4 is connected to the power supply voltage VDD 1. The configuration of the circuit shown in FIG. 2 is the same as that of the circuit shown in FIG. 1 in that the constant voltage VL that is generated by the voltage source 6 is applied to the gate of the transistor M1.

Next, an operation of the limiter circuit 10 shown in FIG. 1 is described hereinafter in detail. In the explanation that follows, VT1 refers to a threshold voltage of the transistor M1.

In the limiter circuit 10 of FIG. 1, the drain of the transistor MP1 is fed back to the gate of the transistor MP1 via the transistor M1 and differential amplifier 5. Accordingly when the transistors MP1 and M1 are operated in a saturation region and a loop gain of the differential amplifier 5 is large enough, a differential input voltage of the differential amplifier 5 becomes small. This enables the limiter circuit 10 to operate to satisfy that the output voltage $V_{OUT}$ is nearly equal to the input voltage $V_{IN}$.

Figure 3:
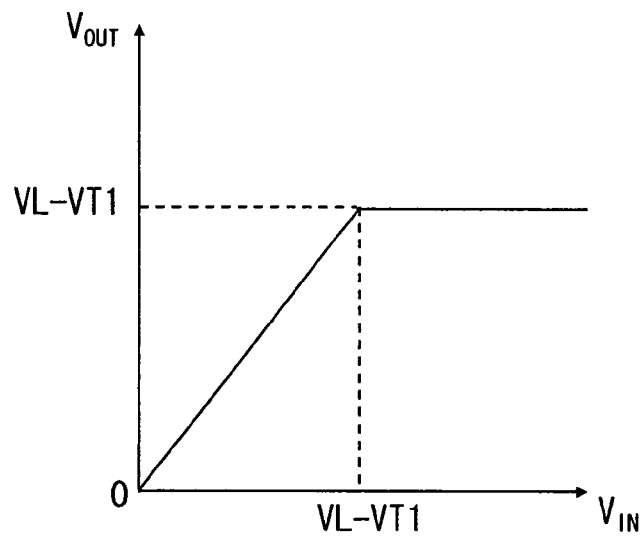
FIG. 3 is a view showing a relationship between input and output voltages in the limiter circuit according to the first embodiment of the present invention.

On the other hand the constant voltage VL is applied to the gate of the transistor M1, which is included in the feedback path, thus an attempt to output a source voltage exceeding VL−VT1 causes the transistor M1 to be OFF. Accordingly if the input voltage $V_{IN}$ exceeds VL−VT1, the transistor M1 becomes OFF, thus the feedback to the gate of the transistor MP1 does not work. Therefore the voltage range of the output voltage $V_{OUT}$ is limited to VL−VT1 or less. A relationship between the input voltage $V_{IN}$ and the output voltage $V_{OUT}$ of the limiter circuit 10 is shown in FIG. 3.

In the limiter circuit 10 of FIG. 1, to constrain the upper limit of the output voltage $V_{OUT}$ to VLM or less, the generation voltage VL of the voltage source 6 may be determined to satisfy the formula (1) below. Specifically, the generation voltage VL of the voltage source 6 may be VLM+VT1 or less.

$$VL-VT1 \leq VLM \tag{1}$$

Figure 12:
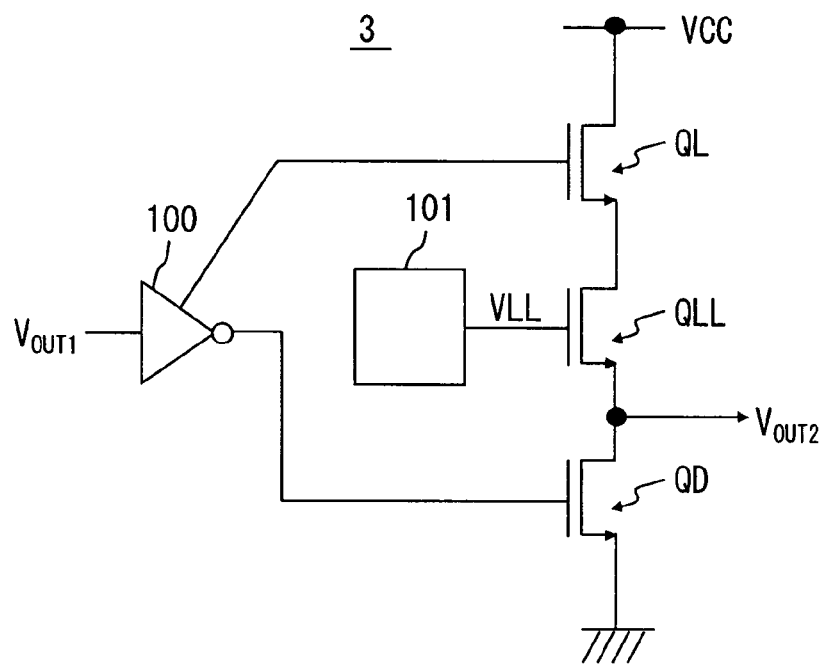
FIG. 12 is a view showing a configuration of a conventional limiter circuit.
Figure 13:
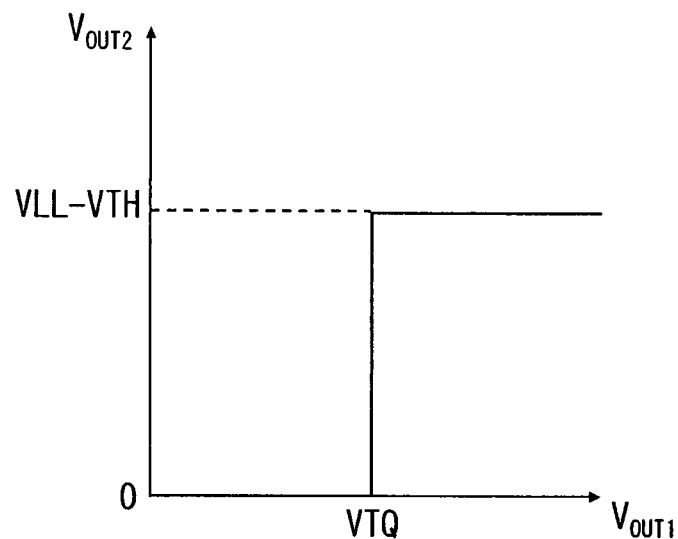
FIG. 13 is view showing a relationship of input and output voltages in the conventional limiter circuit of FIG. 12.

In the conventional limiter circuit of FIG. 12, there has been a problem that a large difference is created in the output voltage with the input voltage being an analog signal. On the other hand, the limiter circuit 10 of this embodiment has a configuration in which the drain of the transistor MP1 is fed back to the gate of the transistor MP1 via the transistor M1 which is applied with the constant voltage VL to its gate and the differential amplifier 5. With this configuration, with the input voltage $V_{IN}$ being the upper limit value or less, the output voltage $V_{OUT}$ changes along with the input voltage $V_{IN}$, and after the input voltage $V_{IN}$ reaches the upper limit value VLM, the circuit operates to limit the output voltage $V_{OUT}$ to the upper limit value VLM. Accordingly it is possible to generate the output voltage $V_{OUT}$ with an error suppressed even when the input voltage $V_{IN}$ is an analog signal.

Figure 14:
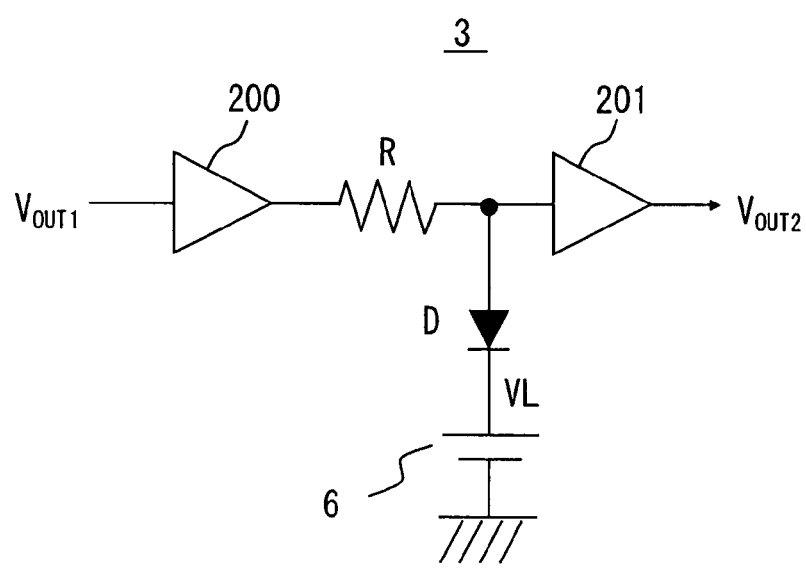
FIG. 14 is a view showing a configuration of a conventional limiter circuit.

Further, as the limiter circuit shown in FIG. 14 includes many devices, signal transmission errors can easily be generated that are caused by characteristic fluctuation in the resistance R, diode D, buffer circuits 200 and 201. On the other hand the limiter circuit 10 of this embodiment is able to limit an output voltage by a simple configuration in which the transistor M1 that is applied with the constant voltage VL to its gate is inserted to an output portion of the first circuit 1 shown in FIG. 11. Further, by performing the abovementioned feedback control, an error in the output voltage can be suppressed. Accordingly the limiter circuit 10 is able to suppress signal transmission error better than the limiter circuit of FIG. 14.

Further, the conventional limiter circuit shown in FIG. 14 needs the buffer circuits 200 and 201 for adjusting impedance to be inserted, thus there is a problem that a consumption current is large. On the other hand, as the limiter circuit 10 of this embodiment includes the transistor M1 which is applied with the constant voltage VL to its gate inserted to the output portion of the first circuit 1 shown in FIG. 11, the buffer circuits 200 and 201 that are used in the conventional limiter circuit shown in FIG. 14 are not required, thereby reducing power consumption as compared to the conventional limiter circuit shown in FIG. 14.

Second Embodiment

Figure 4:
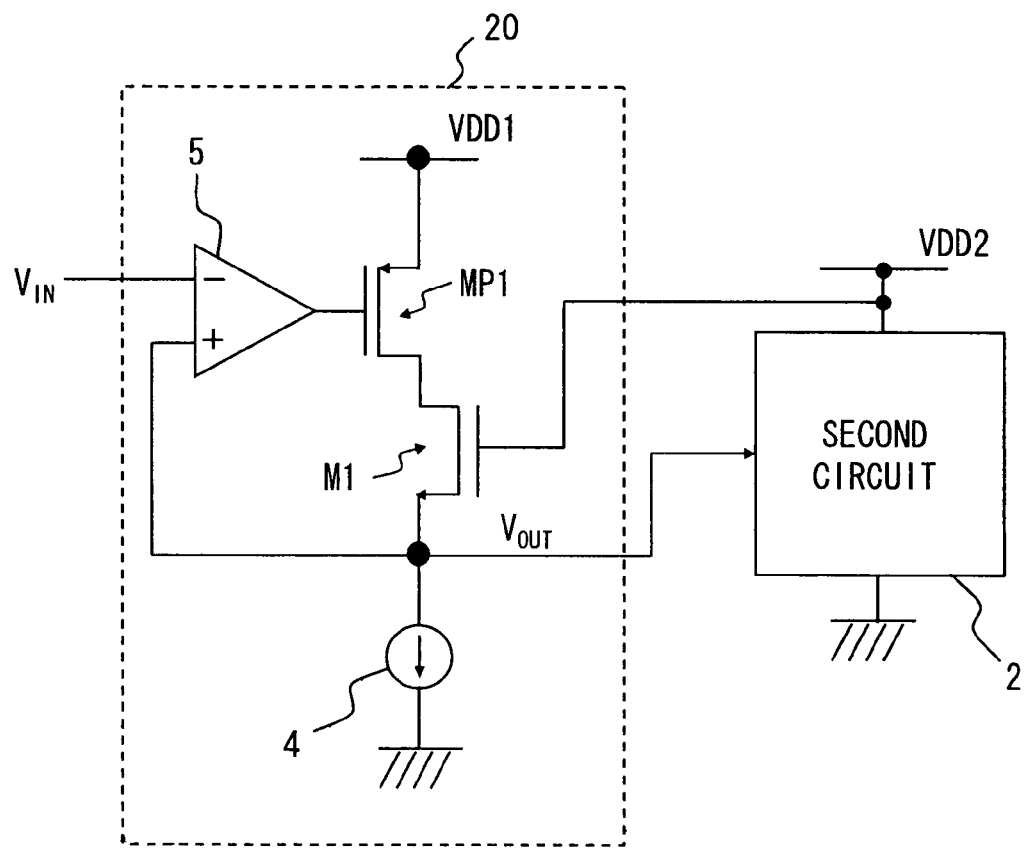
FIG. 4 is a view showing a configuration of a limiter circuit according to a second embodiment of the present invention.

A configuration of a limiter circuit 20 according to this embodiment is shown in FIG. 4. In FIG. 4, the configuration of the circuit is the same as the limiter circuit 10 of the first embodiment in that the input voltage VIN is input to an inverting input of the differential amplifier 5, a feedback path is formed by the differential amplifier 5, the transistor MP1 and the transistor M1, the source of the transistor M1 is connected to one end of the constant current source 4, and the source of the transistor M1 is the output (output voltage $V_{OUT}$) of the limiter circuit 20.

Further in FIG. 4, a second circuit 2 operates with a power supply voltage VDD2. The second circuit 2 is fed with the output voltage of the limiter circuit 20. The limiter circuit 20 of this embodiment has a configuration in which the power supply voltage VDD2 is applied to the gate of the transistor M1. Therefore, the limiter circuit 20 of the this embodiment does not require the voltage source 6 that is connected to the gate of the transistor M1.

Figure 5:
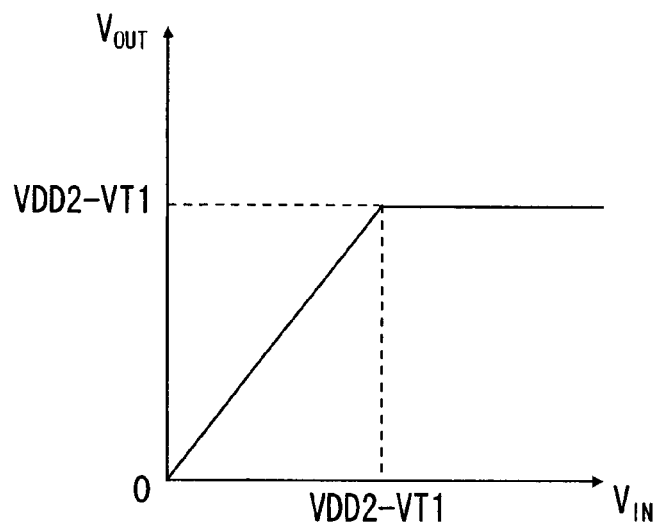
FIG. 5 is a view showing a relationship of input and output voltages in the limiter circuit according to the second embodiment of the present invention.

In the limiter circuit 20, the power supply voltage VDD2 is applied to the gate of the transistor M1. Accordingly the limiter circuit 20 operates so that an upper limit of the output voltage $V_{OUT}$ is limited to VDD2−VT1 or less. Here, the voltage VT1 refers to the threshold voltage of the transistor M1. A relationship between the input voltage $V_{IN}$ and the output voltage $V_{OUT}$ in the limiter circuit 20 is shown in FIG. 5.

Third Embodiment

Figure 6:
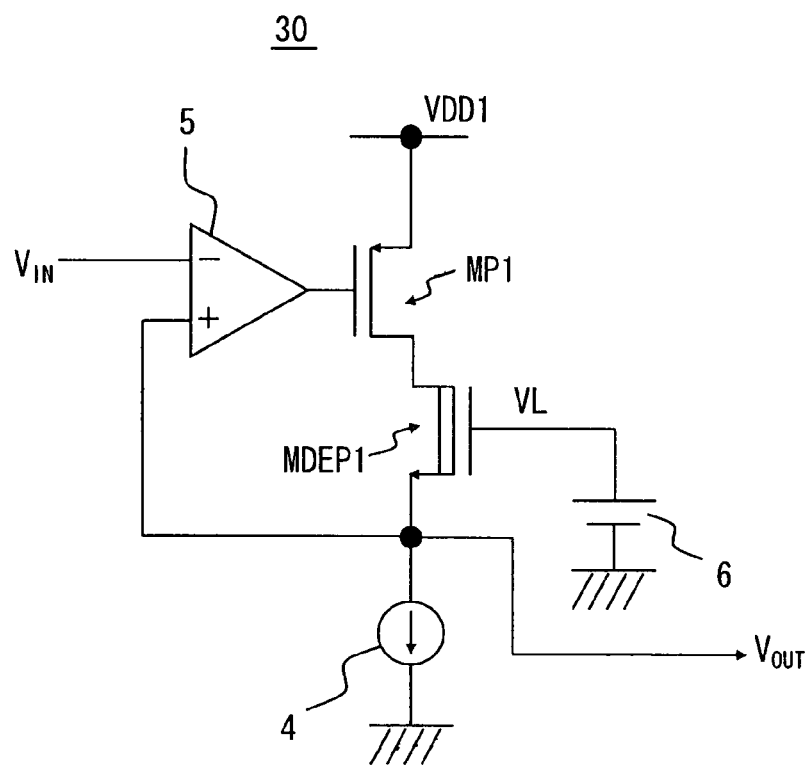
FIG. 6 is a view showing a configuration of a limiter circuit according to a third embodiment of the present invention.

A configuration of a limiter circuit 30 according to this embodiment is shown in FIG. 6. In FIG. 6, MDEP1 is a depletion type Nch-MOS transistor characterized by a negative threshold voltage. A difference from the limiter circuit 10 shown in FIG. 1 is that the transistor M1 is the depletion type transistor MDEP 1.

Specifically, the drain of the transistor MP1 is connected to a drain of the transistor MDEP1, the output of the voltage source 6 is connected to a gate of the transistor MDEP1, a source of the transistor MDEP1 is connected to an end of the constant current source 4 and to the non-inverting input of the differential amplifier 5, and a feedback path is formed by the differential amplifier 5, the transistor MP1 and the transistor MDEP1. Further, the source of the transistor MDEP1 is an output of the limiter circuit 30 (output voltage $V_{OUT}$).

Figure 7:
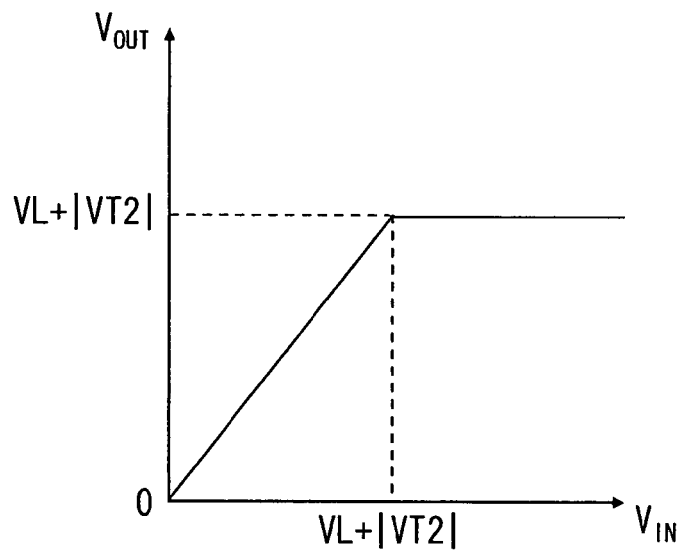
FIG. 7 is a view showing a relationship of input and output voltages in the limiter circuit according to the third embodiment of the present invention.

In the limiter circuit 30, the transistor MDEP1 is a depletion type. Specifically, a threshold voltage VT2 of the transistor MDEP1 is a negative value. Accordingly by changing the transistor M1 included in the limiter circuit 10 of the first embodiment to the depletion type transistor MDEP1, the upper limit VLM of the voltage range of the output voltage $V_{OUT}$ for the limiter circuit 30 is limited to VL−VT2=VL+|VT2| or less. A relationship between the input voltage $V_{IN}$ and the output voltage $V_{OUT}$ in the limiter circuit 30 is shown in FIG. 7.

As described in the foregoing, in the limiter circuit 30 of this embodiment, an upper limit of the output voltage $V_{OUT}$ is limited to VL+|VT2| or less. Thus it is possible to output a higher voltage as compared to the limiter circuit 10 of the first embodiment when the same voltage VL is supplied by the voltage source 6.

Note that the transistor M1 in the limiter circuit 20 shown in FIG. 4 may be a depletion type transistor MDEP1.

Fourth Embodiment

Figure 8:
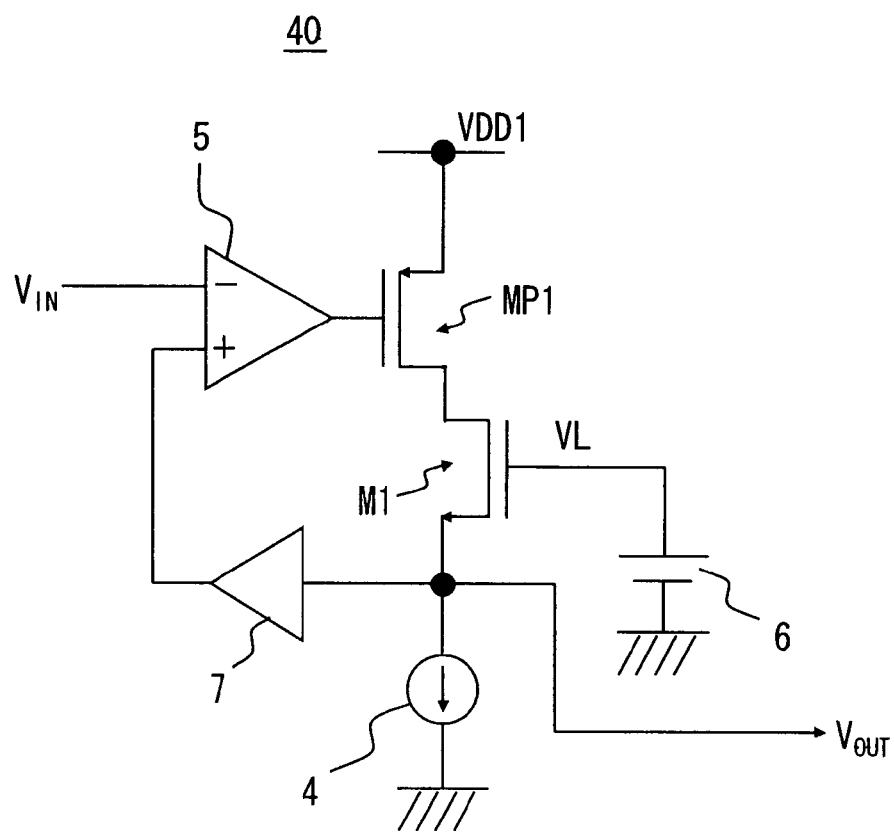
FIG. 8 is a view showing a configuration of a limiter circuit according to a fourth embodiment of the present invention.

A configuration of a limiter circuit 40 according to this embodiment is shown in FIG. 8. In FIG. 8, the configuration is the same as the limiter circuit 10 of the first embodiment shown in FIG. 1 in that the input voltage $V_{IN}$ is input to the inverting input of the differential amplifier 5, the output of the differential amplifier 5 is connected to the gate of the transistor MP1 and the source of the transistor MP1 is connected to the power supply voltage VDD 1.

Further, the configuration is same as the limiter circuit 10 of the first embodiment shown in FIG. 1 in that the drain of the transistor MP1 is connected to the drain of the transistor M1, the source of the transistor M1 is connected to an end of the constant current source 4, the output of the voltage source 6 is connected to the gate of the transistor M1 and source of the transistor M1 is the output voltage $V_{OUT}$ of the limiter circuit 40.

On the other hand, the limiter circuit 40 includes an amplifier 7 for amplifying input signals. Specifically, by the source of the transistor M1 being connected to the amplifier 7 and the output of the amplifier 7 being connected to the non-inverting input of the differential amplifier 5, a feedback path is formed by the differential amplifier 5, the transistor MP1, the transistor M1 and the amplifier 7.

An operation of the limiter circuit 40 is described hereinafter in detail. In the description that follows, a gain of the amplifier 7 is referred to as G. In the limiter circuit 40, the drain of the transistor MP1 is fed back to the gate of the transistor MP1 via the transistor M1, amplifier 7 and the differential amplifier 5. Accordingly, when the transistor MP1 and M1 are operated in a saturation region and also the loop gain of the differential amplifier 5 is large enough, the differential input voltage of the differential amplifier 5 becomes small.

Further in the limiter circuit 40, a signal of the output voltage $V_{OUT}$ that is amplified by G times by the amplifier 7 is the non-inverting input of the differential amplifier 5. Therefore, if the differential input voltage of the differential amplifier 5 is small, the circuit operates to satisfy that the output voltage is nearly equal to $V_{IN}/G$.

Figure 9:
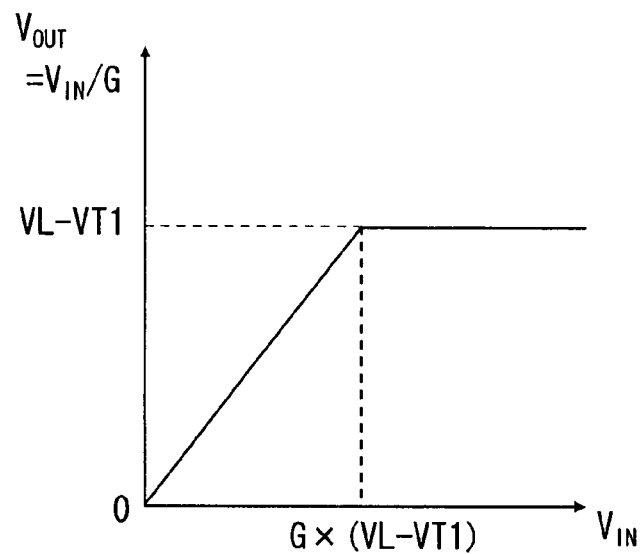
FIG. 9 is a view showing a relationship of input and output voltages in the limiter circuit according to the fourth embodiment of the present invention.
Figure 10:
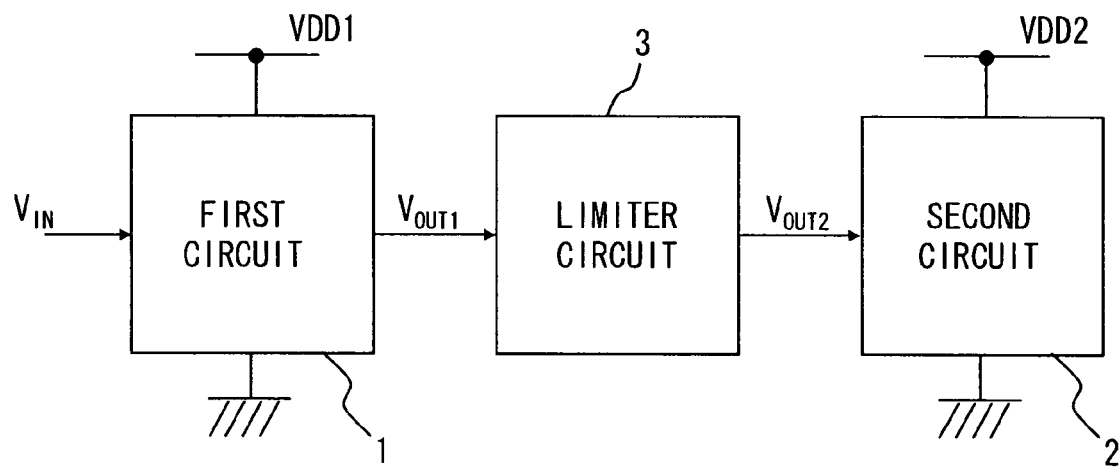
FIG. 10 is a view showing a configuration example of an apparatus including a conventional first and second circuits and a limiter circuit.

On the other hand, as the constant voltage VL is applied to the gate of the transistor M1, that is included in the feedback path, an attempt to output a source voltage exceeding VL−VT1 causes the transistor M1 to be OFF. Accordingly if the input voltage $V_{IN}$ exceeds G×(VL−VT1), the transistor M1 becomes OFF, thus the feedback to the gate of the transistor MP1 does not work. Therefore as with the limiter circuit 10, the voltage range of the output voltage $V_{OUT}$ of the limiter circuit 40 is limited to VL−VT1 or less. A relationship between the input voltage $V_{IN}$ and the output voltage $V_{OUT}$ is shown in FIG. 9.

As set forth above, the limiter circuit 40 of this embodiment is able to lower the voltage level of the output voltage $V_{OUT}$ than that of the input voltage $V_{IN}$. Thus even with the input voltage $V_{IN}$ larger than the upper limit value of the input voltage of the second circuit 2, it is possible to lower the voltage level of the output voltage $V_{OUT}$ by the limiter circuit 40. Therefore, the limiter circuit 40 is able to transmit signal to a subsequent circuit without generating a waveform distortion in the output voltage $V_{OUT}$.

It is apparent that the present invention is not limited to the above embodiment and it may be modified and changed without departing from the scope and spirit of the invention.

What is claimed is:

1. A semiconductor apparatus comprising:
   a limiter circuit comprising:
      a differential amplifier circuit having a non-inverting and an inverting inputs, the inverting input fed with an input signal to the limiter circuit;
      a driving circuit fed with an output of the differential amplifier;
      a MOS transistor having a source, a drain and a gate, one of the source and the drain of the MOS transistor connected to an output of the driving circuit, the other of the source and the drain of the MOS transistor connected to the non-inverting input of the differential amplifier, the gate of the MOS transistor applied with a predetermined voltage; and a load circuit connected to the other of the source and the drain of the MOS transistor, a first voltage source being configured to supply a first operating voltage to a first operating circuit that outputs the input signal of the limiter circuit;

a second operating circuit fed with an output signal of the limiter circuit; and a second voltage source being configured to supply a second operating voltage to the second operating circuit, the second operating voltage being lower than the first operating voltage, wherein:

the MOS transistor is a depletion type MOS transistor such that the limiter circuit has an upper limit of an output voltage greater than the predetermined voltage.

2. The semiconductor apparatus according to claim 1, further comprising an amplifier being disposed between the other of the source and the drain of the MOS transistor and the non-inverting input of the differential amplifier.

3. The semiconductor apparatus according to claim 1, wherein the driving circuit is an Nch-MOS transistor.

4. The semiconductor apparatus according to claim 1, wherein the driving circuit is a Pch-MOS transistor.

5. The semiconductor apparatus according to claim 1, wherein the load circuit is a constant current source.

6. A semiconductor apparatus comprising:

a limiter circuit comprising:

a differential amplifier circuit having a non-inverting and an inverting inputs, the inverting input fed with an input signal to the limiter circuit;

a driving circuit fed with an output of the differential amplifier, an output of the driving circuit connected to the non-inverting input of the differential amplifier;

a MOS transistor having a source, a drain and a gate, one of the source and the drain of the MOS transistor connected to the output of the driving circuit, said one of the source and the drain of the MOS transistor connected to the non-inverting input of the differential amplifier, the gate of the MOS transistor applied with a predetermined voltage; and a load circuit connected to the other of the source and the drain of the MOS transistor;

a first voltage source being configured to supply a first operating voltage to a first operating circuit that outputs the input signal of the limiter circuit;

a second operating circuit fed with an output signal of the limiter circuit; and a second voltage source being configured to supply a second operating voltage to the second operating circuit, the second operating voltage being lower than the first operating voltage, wherein the gate of the MOS transistor is connected to the second voltage source.

7. The semiconductor apparatus according to claim 6, wherein the MOS transistor is a depletion type MOS transistor.

8. The semiconductor apparatus according to claim 6, further comprising an amplifier being disposed between the one of the source and the drain of the MOS transistor and the non-inverting input of the differential amplifier.

9. The semiconductor apparatus according to claim 6, wherein the driving circuit is an Nch-MOS transistor.

10. The semiconductor apparatus according to claim 6, wherein the driving circuit is a Pch-MOS transistor.

11. The semiconductor apparatus according to claim 6, wherein the load circuit is a constant current source.

12. A semiconductor apparatus comprising:

a limiter circuit comprising:

a differential amplifier circuit having a non-inverting and an inverting inputs, the inverting input fed with an input signal to the limiter circuit;

a driving circuit fed with an output of the differential amplifier;

a MOS transistor having a source, a drain and a gate, one of the source and the drain of the MOS transistor connected to an output of the driving circuit, the other of the source and the drain of the MOS transistor connected to the non-inverting input of the differential amplifier, the gate of the MOS transistor applied with a predetermined voltage; and a load circuit connected to the other of the source and the drain of the MOS transistor; and a first voltage source being configured to supply a first operating voltage to a first operating circuit that outputs the input signal of the limiter circuit;

a second operating circuit fed with an output signal of the limiter circuit; and a second voltage source being configured to supply a second operating voltage to the second operating circuit, the second operating voltage being lower than the first operating voltage, wherein the gate of the MOS transistor is connected to the second voltage source.

13. A semiconductor apparatus comprising:

a limiter circuit comprising:

a differential amplifier circuit having a non-inverting and an inverting inputs, the inverting input fed with an input signal to the limiter circuit;

a driving circuit fed with an output of the differential amplifier, an output of the driving circuit connected to the non-inverting input of the differential amplifier;

a MOS transistor having a source, a drain and a gate, one of the source and the drain of the MOS transistor connected to the output of the driving circuit, the gate of the MOS transistor applied with a predetermined voltage; and a load circuit connected to the other of the source and the drain of the MOS transistor;

a first voltage source being configured to supply a first operating voltage to a first operating circuit that outputs the input signal of the limiter circuit;

a second operating circuit fed with an output signal of the limiter circuit; and a second voltage source being configured to supply a second operating voltage to the second operating circuit, the second operating voltage being lower than the first operating voltage, wherein the gate of the MOS transistor is connected to the second voltage source.

14. A semiconductor apparatus comprising:

a limiter circuit to limit an output signal to a predetermined range comprising:

a differential amplifier circuit having a non-inverting and an inverting inputs, the inverting input fed with an input signal to the limiter circuit;

a driving circuit fed with an output of the differential amplifier; a feedback path being configured to connect an output of the driving circuit to the non-inverting input;

a switching device being configured to operate to limit an output signal level of the limiter circuit to a first predetermined limit value or less; and a first voltage source being configured to supply a first operating voltage to a first operating circuit that outputs the input signal of the limiter circuit;

a second operating circuit fed with the output signal of the limiter circuit;

a second voltage source being configured to supply a second operating voltage to the second operating circuit, the second operating voltage being lower than the first operating voltage, and a third voltage source being configured to supply a third operating voltage to the driving circuit, wherein the switching device is disposed between the third voltage source and the non-inverting input.

15. The semiconductor apparatus according to claim 14, wherein the switching device is a MOS transistor having a source, a drain and a gate, one of the source and the drain of the MOS transistor is connected to the output of the driving circuit, the other of the source and the drain of the MOS transistor is connected to the third voltage source, and a voltage to define the first predetermined limit value is applied to the gate of the MOS transistor.

16. The semiconductor apparatus according to claim 15, wherein the MOS transistor is a depletion type MOS transistor.

17. The semiconductor apparatus according to claim 14, further comprising an amplifier inserted in the feedback path.

* * * * *

UNITED STATES PATENT AND TRADEMARK OFFICE
CERTIFICATE OF CORRECTION

PATENT NO.       : 7,629,834 B2                                    Page 1 of 1
APPLICATION NO.  : 11/723025
DATED            : December 8, 2009
INVENTOR(S)      : Hayato Ogawa It is certified that error appears in the above-identified patent and that said Letters Patent is hereby corrected as shown below:

On the front cover of the Patent delete the first application listed under the Foreign Application Priority Data:

"Mar. 17, 2006    (JP)    2006-074349"

Signed and Sealed this

Sixteenth Day of February, 2010

David J. Kappos
*Director of the United States Patent and Trademark Office*